United States Patent [19]

Matsumoto

[11] Patent Number: 4,861,387
[45] Date of Patent: Aug. 29, 1989

[54] SOLAR CELL AND METHOD OF FABRICATING SOLAR CELL

[75] Inventor: Hideo Matsumoto, Itami, Japan

[73] Assignee: Mitsubishi Denki Kabushiki Kaisha, Tokyo, Japan

[21] Appl. No.: 232,092

[22] Filed: Aug. 15, 1988

[30] Foreign Application Priority Data

Sep. 4, 1987 [JP] Japan .................... 62-222513

[51] Int. Cl.⁴ .................... H01L 31/04; H01L 31/18
[52] U.S. Cl. .................... 136/256; 136/262; 156/307.5; 156/315; 437/2; 437/5
[58] Field of Search ............ 136/256, 262; 437/2-5; 156/307.5, 315

[56] References Cited

U.S. PATENT DOCUMENTS

| | | | |
|---|---|---|---|
| 3,472,698 | 10/1969 | Mandelkorn | 136/256 |
| 3,653,970 | 4/1972 | Iles | 136/256 |
| 3,989,541 | 11/1976 | Brandhorst, Jr. | 136/256 |
| 4,133,699 | 1/1979 | Meulenberg, Jr. | 136/256 |
| 4,262,161 | 4/1981 | Carey | 136/256 |
| 4,267,003 | 5/1981 | Mesch et al. | 136/356 |
| 4,294,602 | 10/1981 | Horne | 65/40 |
| 4,619,863 | 10/1986 | Taylor | 428/221 |
| 4,673,770 | 6/1987 | Mandelkorn | 136/259 |
| 4,697,042 | 9/1987 | Schilling | 136/244 |
| 4,714,510 | 12/1987 | Holt | 437/2 |

FOREIGN PATENT DOCUMENTS 62-49675  3/1987  Japan .................... 136/256

*Primary Examiner*—Aaron Weisstuch
*Attorney, Agent, or Firm*—Oblon, Spivak, McClelland, Maier & Neustadt

[57] ABSTRACT

In the adhesive layer (3) for adhering the solar cell body (1) and the cover glass (2), convexly-shaped adhesive convex members (6) are applied and hardened before application of the adhesive layer (3). The convex adhesive members (6) support the cover glass (2) parallel to the upper surface of the solar cell body (1), whereby the thickness of the adhesive layer (3) on the solar cell body is substantially uniform.

6 Claims, 4 Drawing Sheets

SOLAR CELL AND METHOD OF FABRICATING SOLAR CELL

BACKGROUND OF THE INVENTION

1. Field of the Invention

The present invention relates to a structure of a solar cell and a method of fabricating the solar cell, and more particularly, it relates to an improvement in adhering a solar cell body and a cover glass.

2. Description of the Background Arts

FIG. 4 is a perspective view of a conventional solar cell, such as a GaAs solar cell. The solar cell has a solar cell body 1 in which a photoelectric element for converting a solar light to electric energy is formed, and a comb-shaped electrode 5 is provided on the solar cell body 1. An interconnector 4 for interconnecting solar cells is provided such that an end part of the interconnector 4 is on the electrode 5. The interconnector 4 extends to the exterior of the solar cell and is connected to another solar cell.

In order to prevent the solar cell from being damaged by radiation, a cover glass 2 is adhered on the solar cell body 1 through an adhesive layer 3. The adhesive layer 3 is formed by applying an adhesive material on the solar cell body 1 and hardening the same after the cover glass 2 is placed thereon.

When the solar cell is employed in an artificial satellite, the solar cell is subjected to a temporary change whose range is considerably wide, e.g., from −196° C. to +140° C. Therefore, the solar cell should maintain its desired characteristics in the wide range of the temperature.

However, the adhesive layer 3 sometimes peels from the solar cell body 1 and/or the cover glass 2 due to a stress which is caused from the difference between the respective thermal expansion coefficients of the adhered layers. When the adhesive layer 3 has fully peeled, the solar cell is seriously damaged. Even if the peeling of the adhesive layer 3 is only partial, an interfacial void is generated between the adhesive layer 3 and the layer adhered thereto, so that the light received by the solar cell body 1 is increased, thereby reducing the output power of the solar cell.

The peeling probability depends on the thickness of the adhesive layer 3. FIG. 5 is a histogram showing the relationship between the peeling frequency and the thickness of the adhesive layer 3 after a heating cycle is applied to solar cells, where sixty-one of the adhesive layers 3 were subjected to the heating cycle. In FIG. 5, the void bar VB indicates the number of solar cells subjected to the heating cycle, while the bar BC with cross hatching indicates the number of solar cells in which the adhesive layer peeled. It is understood from FIG. 5 that the frequency of probability of the peeling decreases as the thickness of the adhesive layer is increased. For example, the ratio of the number of peeled adhesive layers to that of the total number of prepared adhesive layers is 9/10 for the thickness range 50-60 μm, while the ratio is zero for thicknesses larger than 90 μm.

However, when a thick adhesive material is applied on the solar cell body 1 and a relatively thin cover glass is placed on the adhesive material, the thickness uniformity of the adhesive material is lost due to interfacial tension between the cover glass and the adhesive material, so that the thickness in the center region of the adhesive material becomes smaller than that in the pheripheral region. Further, if the cover glass 2 is not a flat plate but a curved or cambered plate, the uniformity is partially lost. Furthermore, when the cover glass 2 is inclined from the upper surface of the solar cell body 1, the thickness of the adhesive material or the adhesive layer 3 loses uniformity.

SUMMARY OF THE INVENTION

According to the present invention, a solar cell comprises: (a) a solar cell body in which a photoelectric element is formed, (b) a convexly-shaped adhesive member selectively provided on the solar cell body, (c) an adhesive layer provided on the solar cell body such that the adhesive convex member is buried in the adhesive layer, and (d) a transparent plate provided on the adhesive layer, the transparent plate and the solar cell body being adhered through the adhesive layer.

Preferably, the solar cell has a plurality of convexly-shaped adhesive members each of which corresponds to the convex adhesive member defined in (b), and the convexly-shaped adhesive convex members are distributed on the solar cell body.

The present invention is also directed to a method of fabricating a solar cell. According to an aspect of the present invention, the method comprises the steps of: (a) preparing a solar cell body in which a photoelectric element is formed, (b) selectively forming a convexly-shaped adhesive member on the solar cell body, (c) hardening the convex adhesive member, (d) applying an adhesive material on the solar cell body, whereby the convex adhesive member is buried in the adhesive material, and (e) providing a transparent plate on the adhesive so that the transparent plate and the solar cell body are adhered through the adhesive material.

In another aspect of the present invention, a method of fabricating a solar cell comprises the steps of: (a) preparing a solar cell body in which a photoelectric element is formed, (b) selectively placing a hardened convex adhesive member on the solar cell body, (c) applying an adhesive material on the solar cell body, whereby the hardened convex adhesive member is buried in the adhesive material, and (d) providing a transparent plate on the adhesive so that the transparent plate and the solar cell body are adhered through the adhesive material.

Accordingly, an object of the present invention is to provide a solar cell in which a thick and uniform adhesive layer can be provided for adhering a solar cell body and a transparent plate, e.g., a cover glass plate.

Another object of the present invention is to decrease peeling of the adhesive layer from the solar cell body and/or the transparent plate.

Yet another object of the present invention is to provide a method for fabricating a solar cell without losing uniformity in the thickness of the adhesive material.

These and other objects, features, aspects and advantages of the present invention will become more apparent from the following detailed description of the present invention when taken in conjunction with the accompanying drawings.

DESCRIPTION OF THE PREFERRED EMBODIMENTS

A method of fabricating a solar cell according to a preferred embodiment will be described with reference to FIG. 1A–FIG. 1D.

Figure 1A:
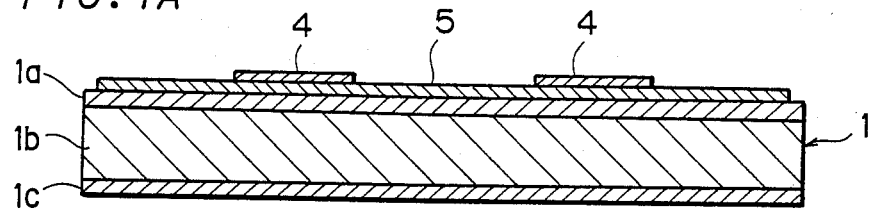
FIG. 1A through FIG. 1D are sections showing fabrication process steps according to a preferred embodiment of the present invention.

In a first process step shown in FIG. 1A, a solar cell body 1 is prepared. The solar cell body 1 has a photoelectric element which may have a p-n junction structure formed of a p-type semiconductor layer $1a$ and an n-type semiconductor layer $1b$. These layers $1a$ and $1b$ may be a p-type GaAs layer and an n-type GaAs layer, respectively. An aluminum electrode $1c$ is formed on the lower surface of the n-type semiconductor layer $1b$. Another type of solar cell body, such as a hetero structure, MIS type, or the like may be employed in place of the p-n junction structure.

Figure 4:
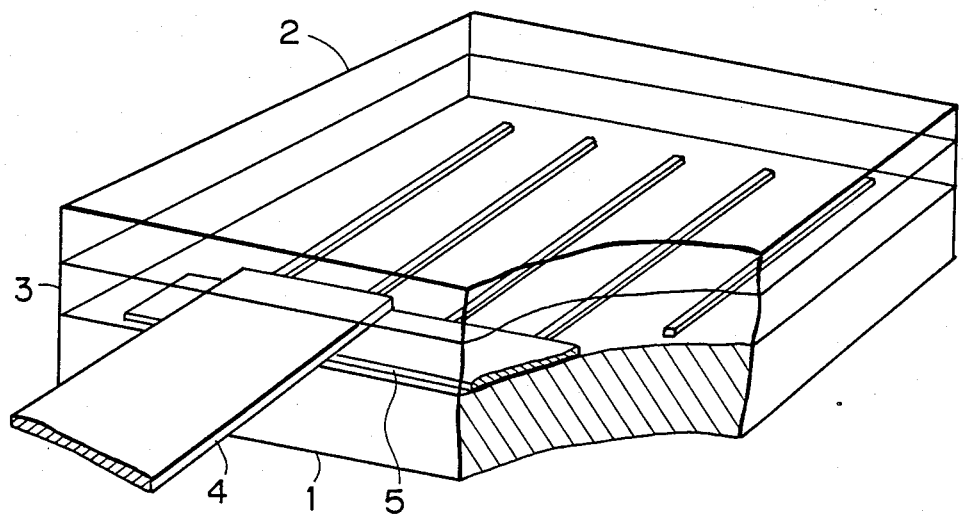
FIG. 4 is a perspective view showing a conventional solar cell.
Figure 5:
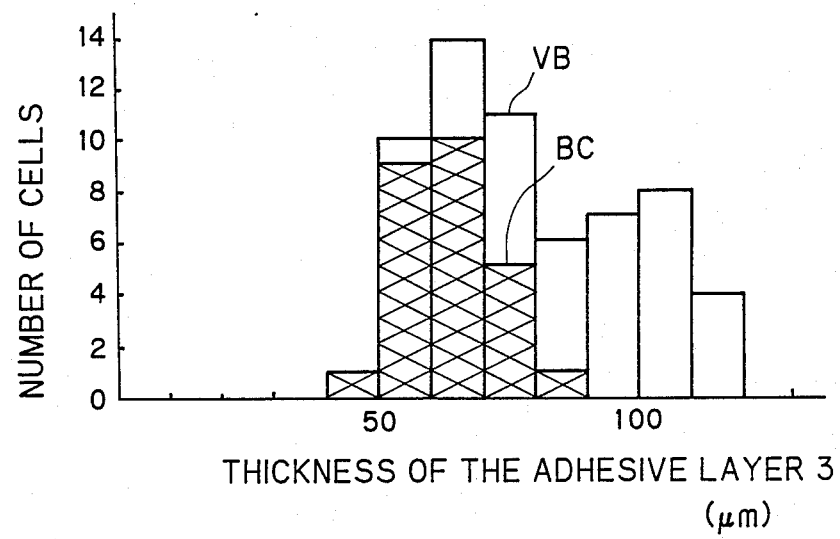
FIG. 5 is a histogram showing the frequency of peeling an adhesive layer as a function of the thickness of the adhesive material corresponding to the adhesive layer.

On the upper surface of the p-type semiconductor layer $1a$ on which solar light is to be received, a comb type electrode 5 made of Ag which is similar to that shown in FIG. 4 is provided. Further, interconnectors 4 made of Ag are provided on the electrode 5 to interconnect the solar cell to another solar cell (not shown).

Figure 1B:
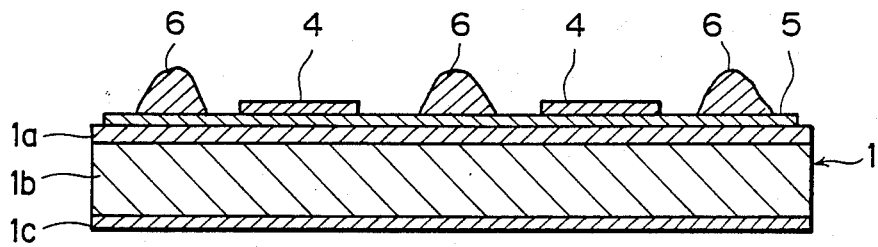
Figure 2A:
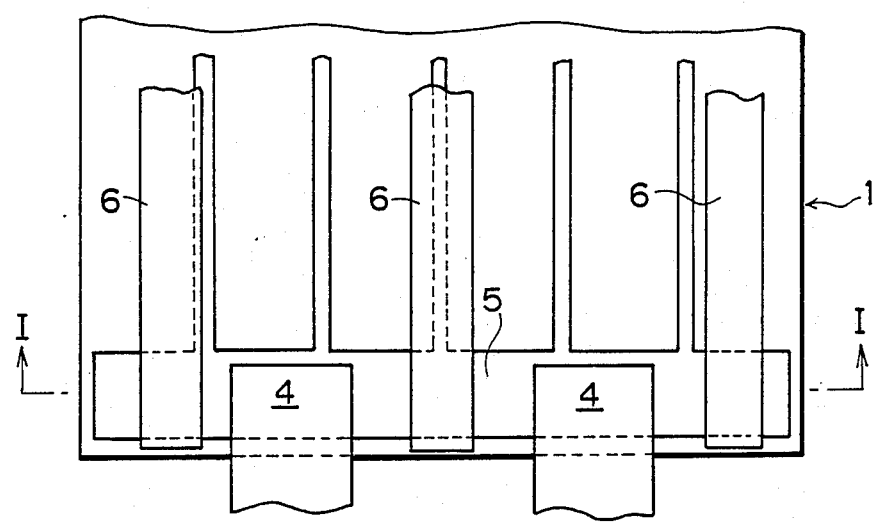
FIG. 2A and FIG. 2B are plane views of the structure of the solar cell being fabricated.
Figure 2B:
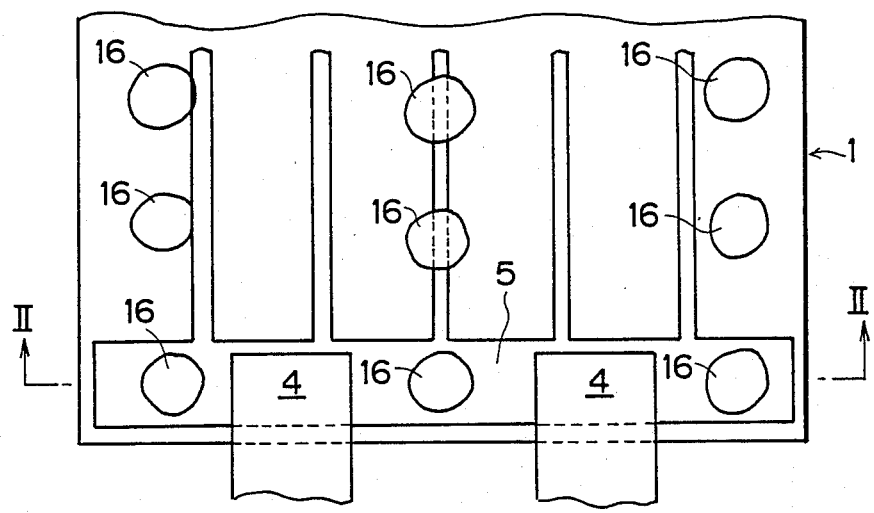

In the next process step shown in FIG. 1B, an adhesive material such as silicone resin is selectively applied on the solar cell body 1, to form transparent convex adhesive members 6 made of the silicone resin. The plane view of the structure in FIG. 1B is shown in FIG. 2A, whose I—I section corresponds to FIG. 1B. Each of the convex adhesive members 6 is a convex adhesive band extending along a respective tooth of the comb-type electrode 5. The convex adhesive members of bands 6 are aligned in parallel. Alternatively, the convex adhesive members 6 may be convexly-shaped adhesive spots 16 shown in FIG. 2B, which are distributed on the solar cell body 1. The cross section along line II—II of FIG. 2B is also given by FIG. 1B in which the reference numeral 6 is interpreted as the numeral 16. The respective heights of the convex adhesive members 6 and 16 are substantially equal to each other.

Figure 1C:
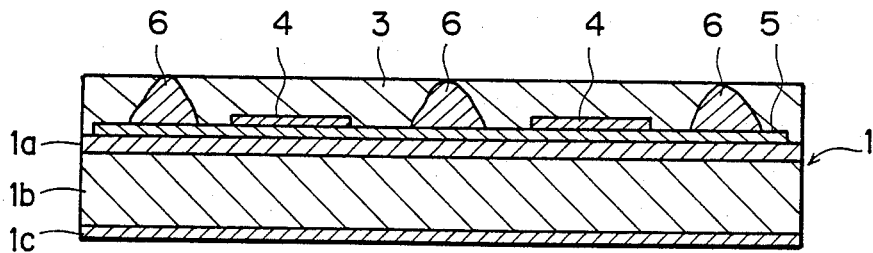

After the convex adhesive members 6 are hardened through exposure to the atmosphere, a transparent adhesive material 3 such as silicone resin is uniformly applied on the solar cell body 1, whereby the hardened convex adhesive members 6 made of silicone resin are buried in the adhesive material 3, as shown in FIG. 1C. Preferably, the thickness of the adhesive material 3 is substantially equal to or slightly larger than the height of the convex adhesive members 6.

Figure 1D:
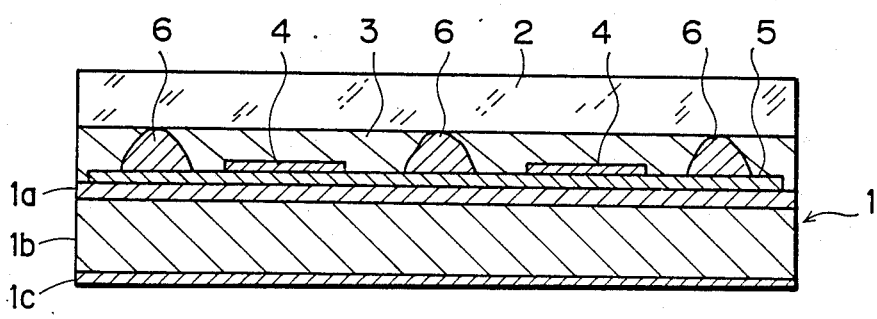

Before the adhesive material 3 is hardened, a transparent cover glass plate 2 shown in FIG. 1D is placed on the adhesive material 3. Since the hardened convex adhesive members 6 support the cover glass 2, the cover glass 2 maintains its position in parallel to the upper surface of the solar cell body 1. Therefore, the uniformity of the thickness of the adhesive material 3 is not lost, even if the adhesive material 3 is thick. Also, even when the cover glass 2 before being placed on the adhesive material 3 is curved or cambered, the cover glass 2 is forced into a plane form due to the support by the convex adhesive members 6. In the preferred embodiment, the thickness of the cover glass 2, the electrode 5, the interconnector 4 and the solar cell body are 50–150 μm, 4–5 μm, 10–30 μm and 50–300 μm, respectively. The thickness of the adhesive material 3 is greater than 90 μm.

Therefore, when the adhesive material 3 is hardened to become a hardened adhesive layer, the thickness of the adhesive layer 3 is uniform, so that the adhesive layer 3 is prevented from peeling from the solar cell body 1 and/or the cover glass 2. Since the convex members 6 are made of an adhesive substance, the adhesion of the same to the solar cell body 1 is also tight. The respective adhesive materials for forming the convex adhesive members 6 and the adhesive layer 3 may be different from each other.

Figure 3:
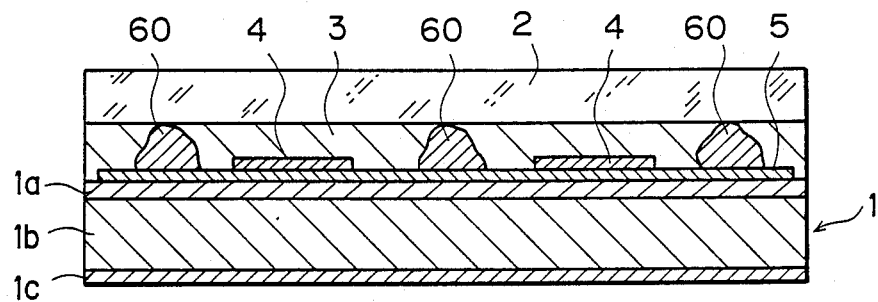
FIG. 3 is a section of a solar cell according to another preferred embodiment of the present invention.

FIG. 3 shows a solar cell according to another preferred embodiment of the present invention. In the solar cell shown in FIG. 3, previously hardened convex members or pieces 60 are distributed over the solar cell body 1. After the distributing step, the adhesive material 3 is applied on the solar cell body 1 such that the convex members 60 are buried in the adhesive material 3. The other process steps are identical with those of the embodiment shown in FIG. 1.

In both of the embodiments, the convex adhesive members 6, 16, 60 may be distributed over the upper surface of the body 1 in a uniform density, or alternatively, they may be provided only on the part of the body 1 on which the adhesive material 3 tends to be thinned if the adhesive convex members are not provided.

As described above, the uniformity in thickness of the adhesive layer 3 is maintained with the convex adhesive members according to the present invention, and therefore, the adhesive layer 3 can be thickened without peeling and without reducing the output power of the solar cell.

Although the present invention has been described and illustrated in detail, it is clearly understood that the same is by way of illustration and example only and is not to be taken by way of limitation, the spirit and scope of the present invention being limited only by the terms of the appended claims.

I claim:

1. A solar cell comprising:
   (a) a solar cell body in which a photoelectric element is formed,
   (b) at least one convexly-shaped adhesive member selectively provided on the surface of said solar cell body,
   (c) an adhesive layer provided on said solar cell body such that said at least one convexly-shaped adhesive member is buried in said adhesive layer, and
   (d) a transparent plate provided on said adhesive layer, said transparent plate and said solar cell body being adhered through said adhesive layer.

2. A solar cell in accordance with claim 1, wherein: said solar cell has a plurality of convexly-shaped adhesive members distributed on said surface of said solar cell body.

3. A solar cell in accordance with claim 2, wherein: said convexly-shaped adhesive members are convex adhesive bands.

4. A solar cell in accordance with claim 2, wherein: said convexly-shaped adhesive members are convex adhesive spots.

5. A method of fabricating a solar cell, comprising the steps of:
(a) preparing a solar cell body in which a photoelectric element is formed,
(b) selectively forming at least one convexly-shaped adhesive member on the surface of said solar cell body,
(c) hardening said at least one convexly-shaped adhesive member,
(d) applying an adhesive material on said solar cell body, whereby said at least one convexly-shaped adhesive member is buried in said adhesive material, and
(e) providing a transparent plate on said adhesive so that said transport plate and said solar cell body are adhered through said adhesive material.

6. A method of fabricating a solar cell comprising the steps of:
(a) preparing a solar cell body in which a photoelectric element is formed,
(b) selectively positioning at least one hardened convexly-shaped adhesive member on the surface of said solar cell body,
(c) applying an adhesive material on said solar cell body, whereby said at least one hardened convexly-shaped adhesive member is buried in said adhesive material, and
(d) providing a transparent plate on said adhesive so that said transparent plate and said solar cell body are adhered through said adhesive material.

* * * * *